United States Patent
Lin et al.

(10) Patent No.: US 7,115,438 B2
(45) Date of Patent: Oct. 3, 2006

(54) METHOD FOR MANUFACTURING A COMPLEMENTARY METAL-OXIDE SEMICONDUCTOR SENSOR

(75) Inventors: Chi-Rong Lin, Chang-Hua (TW); Nien-Chung Jiang, Taipei (TW); Chih-Sheng Chang, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 147 days.

(21) Appl. No.: 10/834,125

(22) Filed: Apr. 29, 2004

(65) Prior Publication Data

US 2005/0245013 A1    Nov. 3, 2005

(51) Int. Cl.
*H01L 21/00* (2006.01)
(52) U.S. Cl. .......................... 438/57; 438/200
(58) Field of Classification Search ............ 438/57, 438/200
See application file for complete search history.

(56) References Cited

U.S. PATENT DOCUMENTS

| 6,472,243 B1 * | 10/2002 | Gogoi et al. ............. 438/50 |
| 6,838,298 B1 * | 1/2005 | Lee ....................... 438/29 |
| 2004/0129990 A1 * | 7/2004 | Lee ....................... 438/57 |

* cited by examiner

*Primary Examiner*—Chandra Chaudhari
(74) *Attorney, Agent, or Firm*—Nath & Associates PLLC; Harold L. Novick

(57) ABSTRACT

A method for manufacturing a complementary metal-oxide semiconductor sensor is provided. The present method provides a semiconductor structure including a plurality of conductors thereon. An inter-metal dielectric layer is formed on the conductors. A silicon nitride film is applied on the inter-metal dielectric layer. An oxide layer is formed on the silicon nitride film. The oxide layer, the silicon nitride film and the inter-metal dielectric are etched to expose portions of the conductors. The oxide layer and the exposed conductors are cleaned in a cleaning step later.

14 Claims, 5 Drawing Sheets

METHOD FOR MANUFACTURING A COMPLEMENTARY METAL-OXIDE SEMICONDUCTOR SENSOR

BACKGROUND OF THE INVENTION

1. Field of the Invention

The present invention relates to a method for manufacturing a metal-oxide semiconductor sensor, and more particularly to a method for manufacturing a metal-oxide semiconductor sensor having a more oxide layer.

2. Description of the Prior Art

For manufacturing a metal-oxide semiconductor sensor, a protective layer for preventing the inter-metal dielectric layer, IMD layer, from plasma damage to reduce dark current is formed on the inter-metal dielectric layer.

As shown in FIG. 1A, a semiconductor structure 100 including elements, e.g. a source, a gate, a drain, etc., of a MOS sensor is provided, wherein the elements of the MOS are not shown in FIG. 1A. A plurality of conductors 102 is applied on the semiconductor structure 100, wherein there is only a conductor 102 shown in FIG. 1A. An inter-metal dielectric layer 104, IMD layer, is deposited onto the conductors 102. The IMD layer 104 may cover portions of the semiconductor structure 100 that are not covered by conductors 102. A protective layer 106 is formed onto the IMD layer 104 to prevent the damage from plasma and to reduce the dark current.

As shown in FIG. 1B, the protective layer 106 and the IMD layer 104 is subsequently etched after patterning the protective layer 106. After the etching step, via holes 108 are formed inside the protective layer 106 and the IMD layer 104 and on portions of the conductors 102 to expose the surfaces of the exposed conductors 102. As shown in FIG. 1C, a cleaning step cleans the protective layer 106 and the exposed conductors 102 before forming a glue layer onto the protective layer 106 of the MOS sensor, wherein the glue layer is not shown in FIG. 1C. After the cleaning step, the cleaned protective layer 106 becomes thinner, wherein a plurality of particles composed of the material of the protective layer 106 are formed.

As shown in FIG. 1D, the MOS sensor is moved into a process-chamber 110 before the cleaning step. The process chamber 110 includes a bell jar 112 and a tank 114, wherein the process chamber 110 is covered by the bell jar 112. When the cleaning step cleans the protective layer 106 and the exposed conductors 102, a plurality of particles 106' forms due to the thinning protective layer 106. The material of the produced particles 106' and the material of the protective layer 106 are the same. The particles 106' are adhered on the bell jar 112 to prevent the semiconductor structure 100, the elements on the semiconductor structure 100 and the whole MOS sensor from the particles 106'. The MOS sensor is removed from the process chamber 110 later.

If the particles 106' adhered on the bell jar 112 drop on the MOS sensor, the MOS sensor may be broken due to the dropped particles 106'. The yield for manufacturing the MOS sensors is reduced due to the broken MOS sensors. To maintain the yield for manufacturing the MOS sensors, a new bell jar 112 replaces a used bell jar 112 filled with particles 106' to prevent particles 106' from dropping.

A new bell jar 112 replaces a used bell jar 112 after manufacturing the MOS sensors on about 1250–1500 pieces of wafers except CMOS sensors. When manufacturing CMOS sensors, a new bell jar 112 has to replace a used bell jar 112 after manufacturing the CMOS sensors on about 200–300 pieces of wafers. The cost of the bell jars 112 for manufacturing the CMOS sensors is much higher than the cost of the bell jars 112 for manufacturing the other kinds of MOS sensors because of changing the bell jar 112. The preventive maintenance period for changing a bell jar 112 for manufacturing the CMOS sensors is much shorter than the preventive maintenance period for changing a bell jar 112 for manufacturing the other kinds of MOS sensors.

A prior method for reducing the cost and increasing the preventive maintenance period for manufacturing the CMOS sensors is to coat a ceramic layer on the bell jar 112 to rough the surface of the bell jar 112 for adhering more particles 106' produced by the cleaned protective layer 106. Even if the bell jar 112 having a rougher surface does adhere little more particles 106', the improvement due to the ceramic layer is still not good enough. The cost for manufacturing the CMOS sensors is still higher than the cost for manufacturing the other kinds of the MOS sensors. The preventive maintenance period for manufacturing the CMOS sensors is still shorter than the preventive maintenance period for manufacturing the other kinds of the MOS sensors. The efficiency for manufacturing the CMOS sensors by the prior improved method is not enough.

According to the above description, it is necessary to develop a method to reduce the cost and increase the preventive maintenance period for manufacturing complementary metal-oxide semiconductor sensors.

SUMMARY OF THE INVENTION

In accordance with the present invention, a method is provided to substantially overcome the drawbacks of the above mentioned problems for manufacturing complementary metal-oxide semiconductor sensors.

Accordingly, it is one objective of the present invention to provide a method for manufacturing complementary metal-oxide semiconductor sensors. The present invention coats a sacrificial layer formed on a protective layer of a CMOS sensor to prevent particles from dropping.

It is another objective of the present invention to provide a method for manufacturing complementary metal-oxide semiconductor sensors. The present invention provides a sacrificial layer formed on a protective layer to prevent the CMOS sensor from broken due to particles to increase the yield for manufacturing the CMOS sensors.

It is a further objective of the present invention to provide a method for manufacturing complementary metal-oxide semiconductor sensors. The present invention provides a sacrificial layer formed on a protective layer to increase the preventive maintenance period for manufacturing the CMOS sensors.

It is a further objective of the present invention to provide a method for manufacturing complementary metal-oxide semiconductor sensors. The present invention provides a sacrificial layer formed on a protective layer to reduce the cost for manufacturing the CMOS sensors.

In accordance with the present invention, a method for manufacturing a complementary metal-oxide semiconductor sensor is disclosed. The present method provides a semiconductor structure including a plurality of conductors thereon. An dielectric layer is formed on the conductors and the semiconductor structure. A protective layer is applied on the dielectric layer to prevent the dielectric layer from plasma damage and reduce dark current. An sacrificial layer is formed on the protective layer and then is patterned by a pattern. The sacrificial layer, the protective layer and the dielectric are etched to expose portions of the conductors. The sacrificial layer and the exposed conductors are cleaned in a cleaning step later.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

These preferred embodiments of the present invention are now described in greater detail. Nevertheless, it should be recognized that the present invention can be practiced in a wide range of other embodiments besides those explicitly described, and the scope of the present invention is expressly not limited except as specified in the accompanying claims.

Figure 1A:
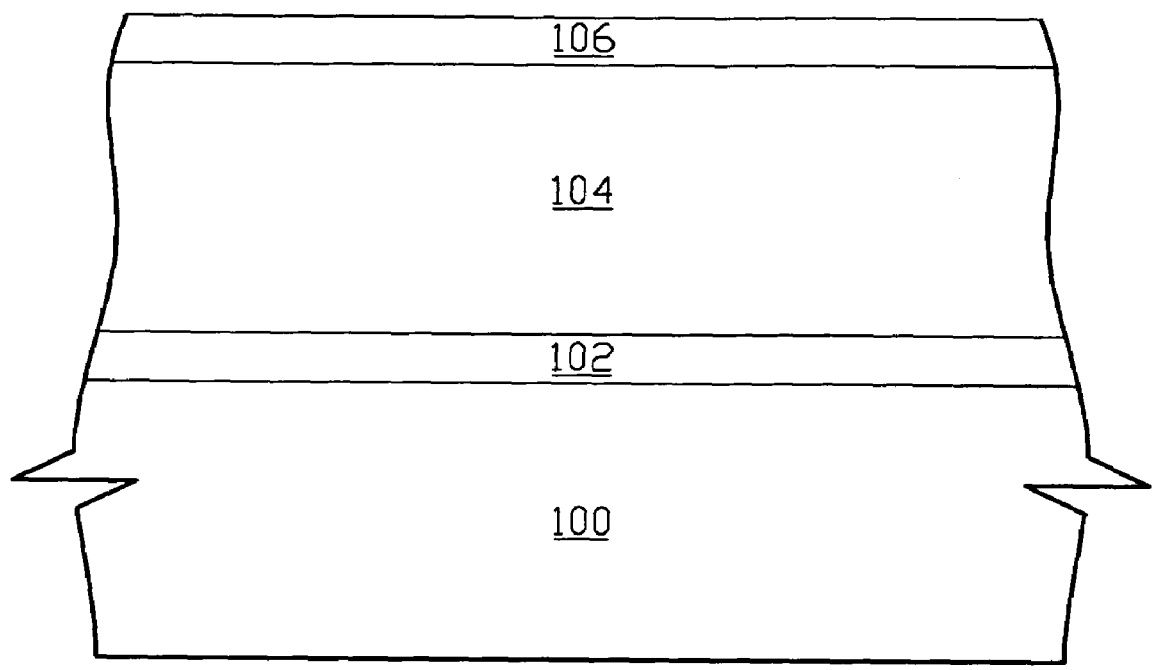
FIGS. 1A–1D illustrate cross sections of a method for manufacturing a MOS sensor in the prior art.
Figure 1B:
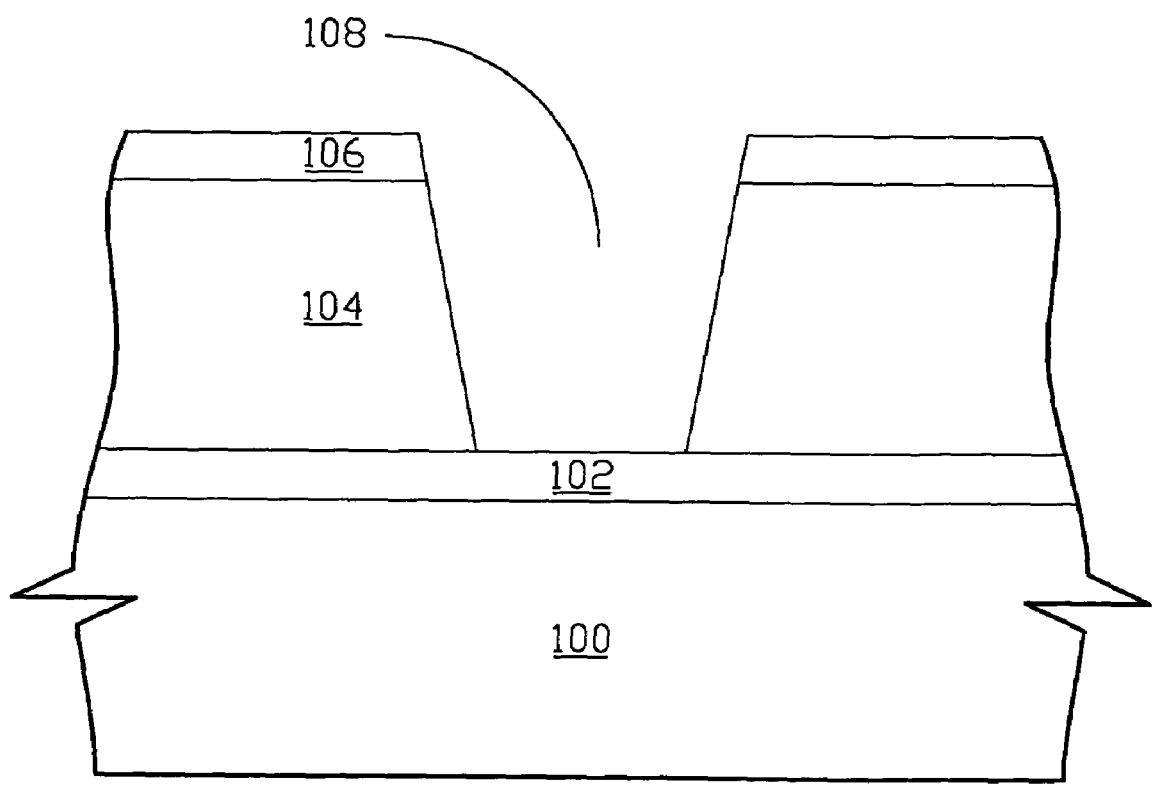
Figure 1C:
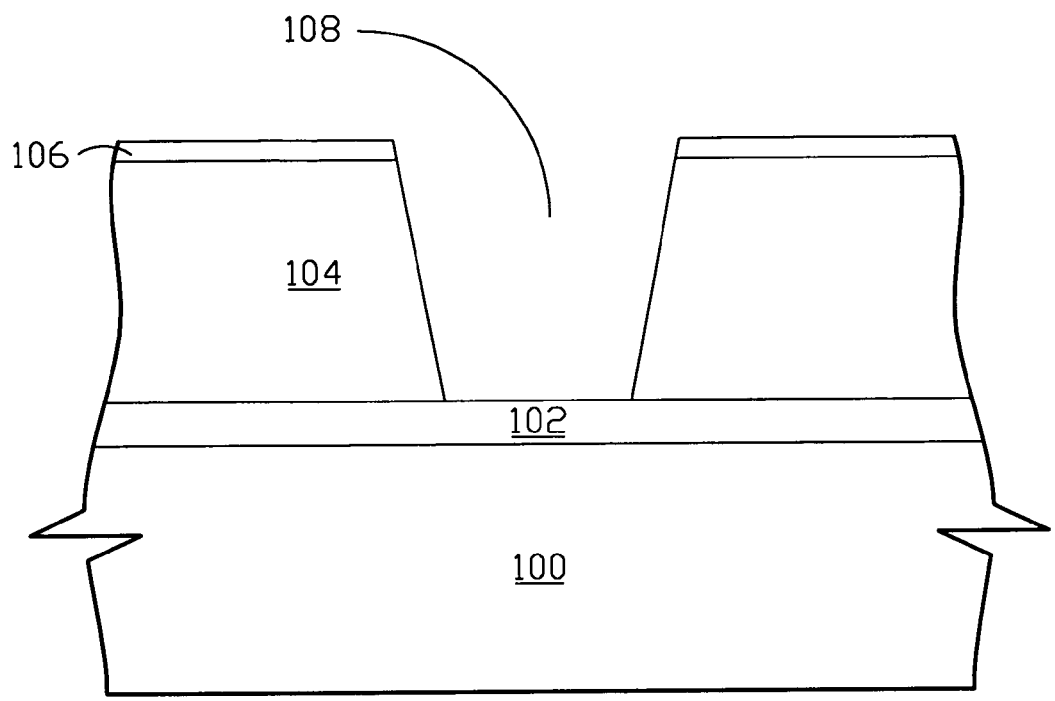
Figure 1D:
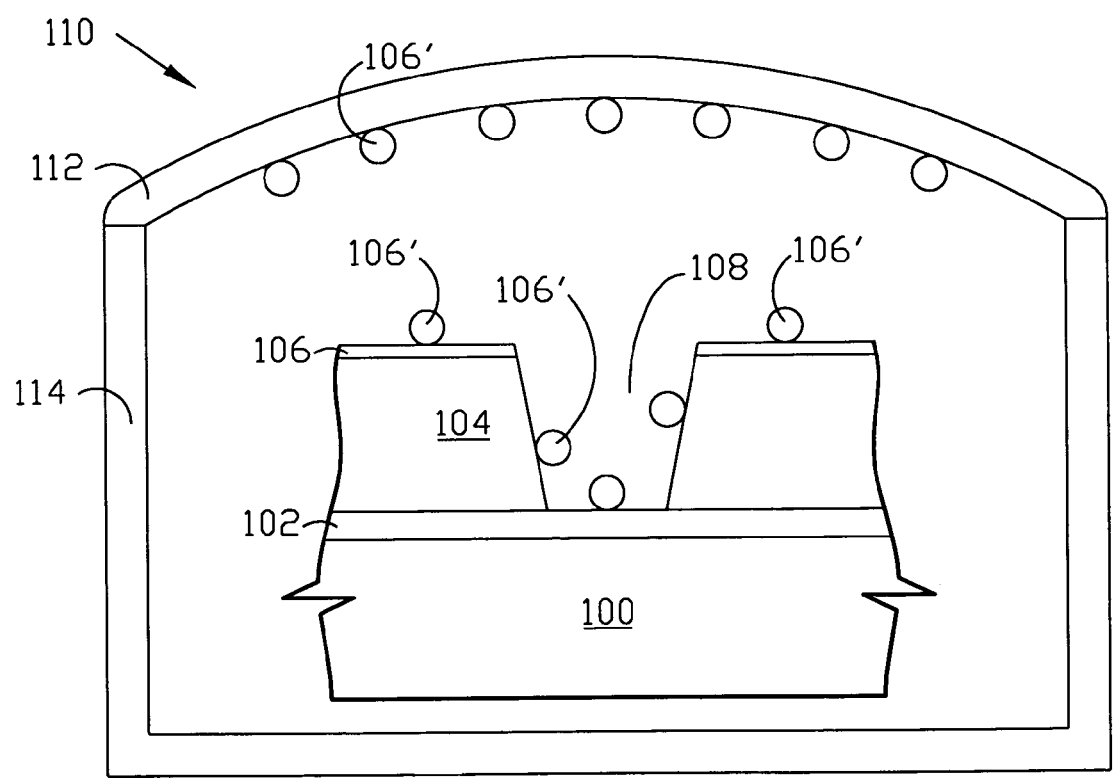
Figure 2A:
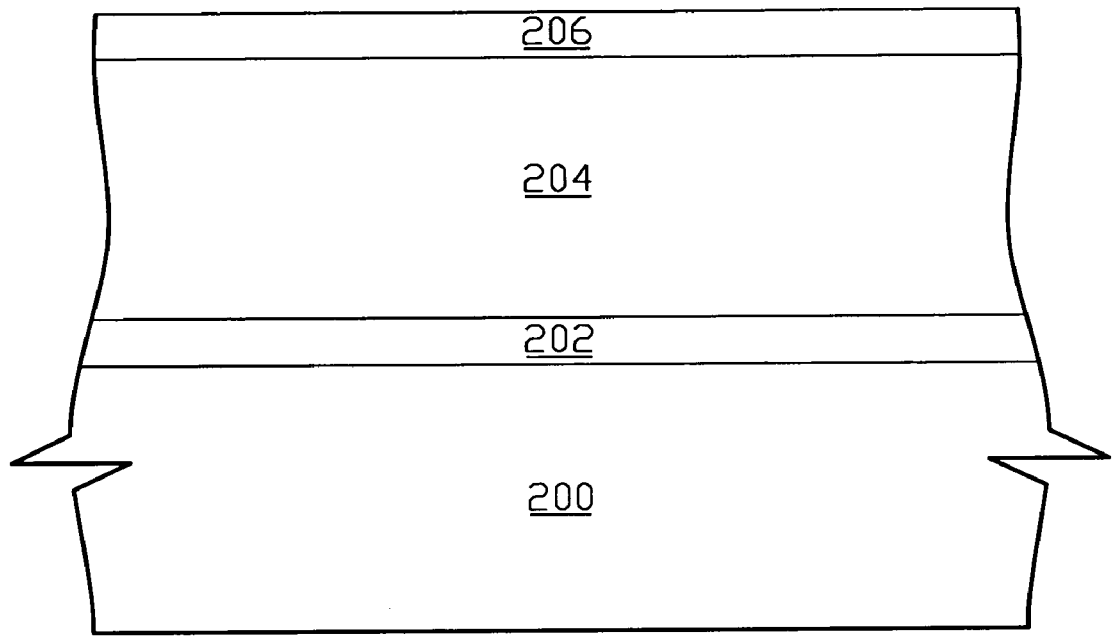
FIGS. 2A–2E illustrate cross sections of a method for manufacturing a CMOS sensor of the present invention.

As illustrated in FIG. 2A, the embodiment of the present invention provides a semiconductor structure 200 including elements of a CMOS sensor, wherein the whole CMOS sensor and the elements of the CMOS sensor are not shown in FIG. 2A. A plurality of conductors 202 is applied on the semiconductor structure 200, wherein there is only a conductor 202 shown in FIG. 2A. A dielectric layer, i.e. an IMD layer 204, is formed, e.g. deposited, onto the conductors 202. The IMD layer 204 may cover portions of the semiconductor structure 200 that are not covered by conductors 202. A protective layer, i.e. a silicon nitride film 206, is formed onto the IMD layer 204 to prevent the damage from plasma and to reduce the dark current.

Figure 2B:
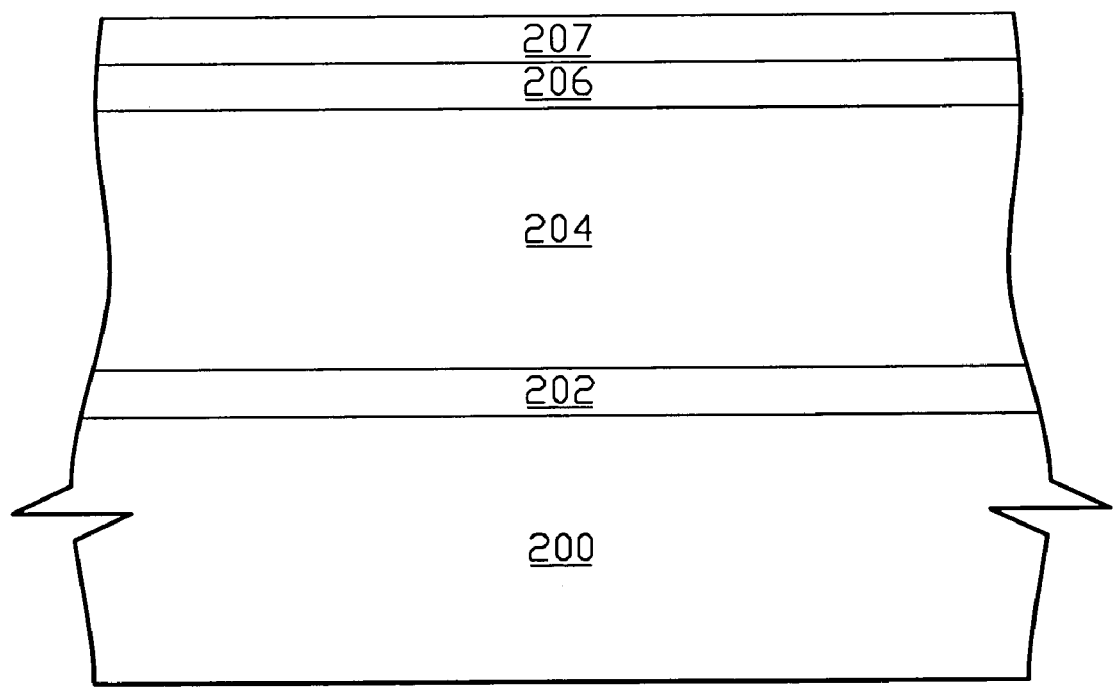
Figure 2C:
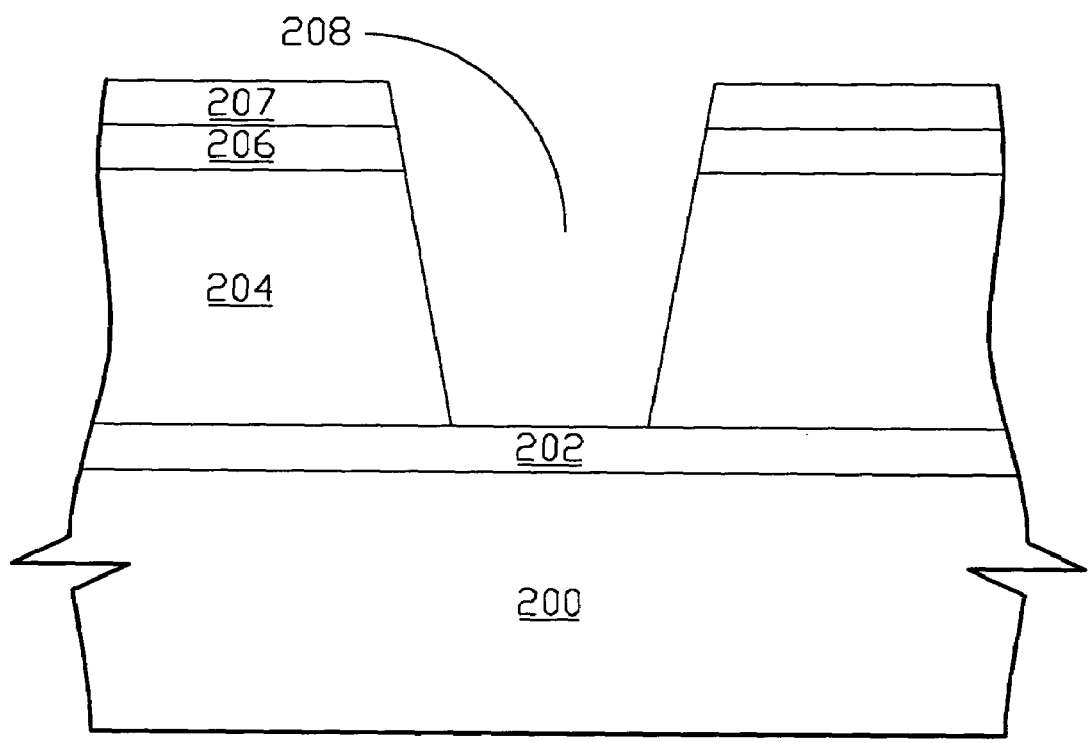
Figure 2D:
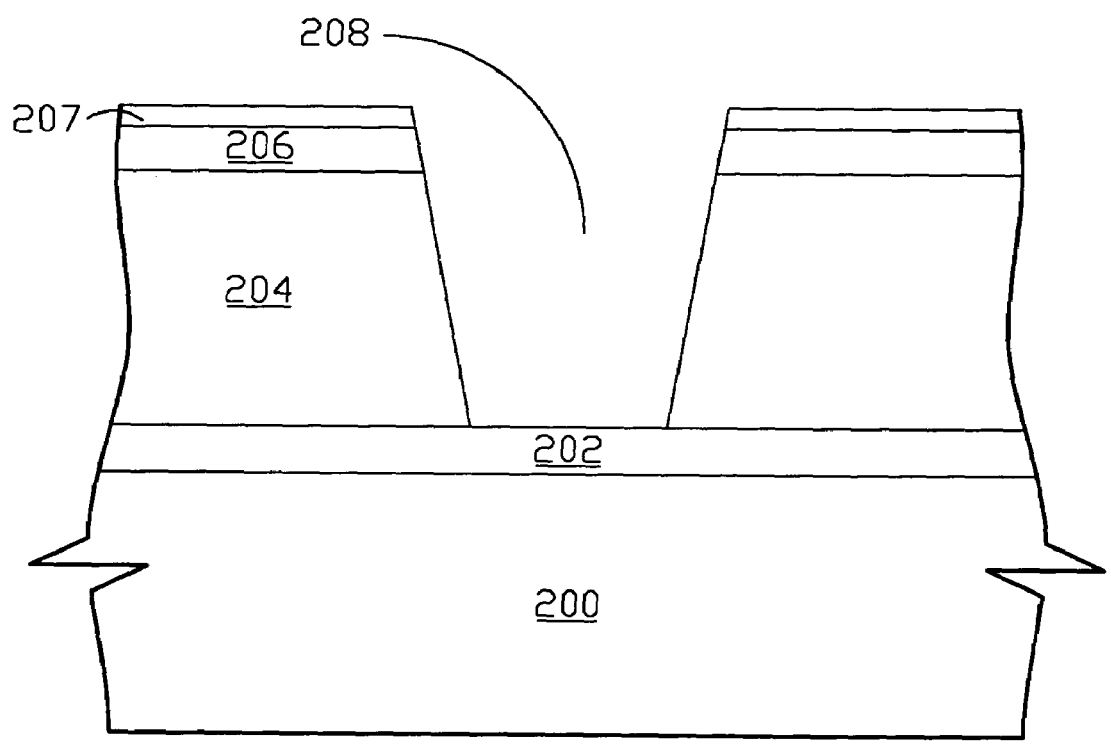

As shown in FIG. 2B, a sacrificial layer, i.e. an oxide layer 207, is formed, e.g. deposited, onto the SiN film 206, i.e. the silicon nitride film 206. The oxide layer 207, the SiN film 206 and the IMD layer 204 is subsequently etched after patterning the oxide layer 207, as shown in FIG. 2C. After the etching step, via holes 208 are formed inside the oxide layer 207, the SiN film 206 and the IMD layer 204 and on portions of the conductors 202 to expose the surfaces of the exposed conductors 202. As shown in FIG. 2D, a cleaning step cleans the oxide layer 207 and the exposed conductors 202 before forming a glue layer onto the oxide layer 207, wherein the glue layer is not shown in FIG. 2D. After the cleaning step, the cleaned oxide layer 207 becomes thinner.

Figure 2E:
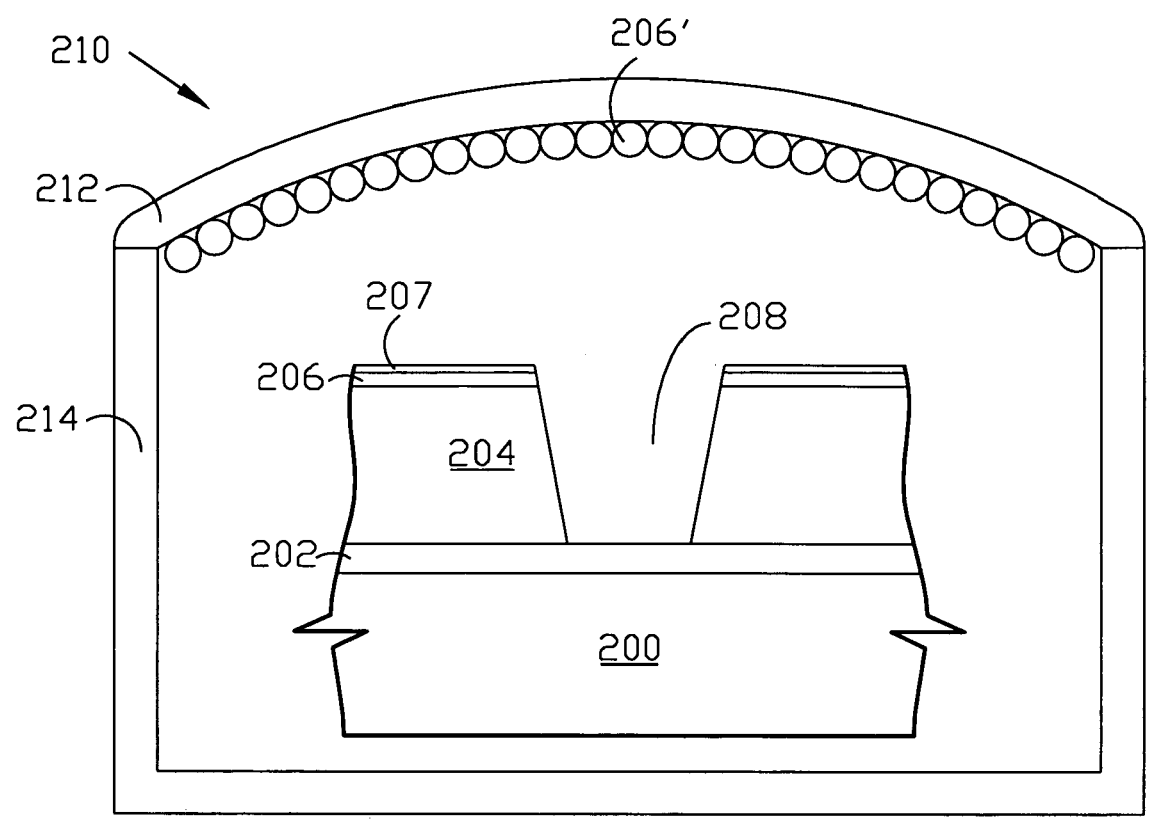

As shown in FIG. 2E, the CMOS sensor is moved into a process chamber 210 before the cleaning step. The process chamber 210 includes a bell jar 212 and a tank 214, wherein the process chamber 210 is covered by the bell jar 212. When the cleaning step cleans the oxide layer 207 and the exposed conductors 202, a plurality of particles 206' forms due to the thinning oxide layer 207. The sacrificial layer, i.e. the oxide layer 207, contains a material that is the same as a composing material of said bell jar 212 to substantially reduce particulate contamination generated from said SiN film 206 in the cleaning step. The material of the oxide layer 207 is oxide. The composing material of the bell jar 212 is silicon dioxide or aluminum oxide. Thus the composition of the produced particles 206' and the composition of the oxide layer 207 are the same. The particles 206' are adhered on the bell jar 212 to prevent the semiconductor structure 200, the elements on the semiconductor structure 200 and the whole CMOS sensor from adhered by the particles 206'. The CMOS sensor is removed from the process chamber 210 hereafter. A plurality of plugs are formed inside the via holes 208 and onto the exposed conductors 202 later, wherein the plugs are not shown in FIG. 2E.

The efficiency for adhering the particles 206' produced during the cleaning step by the bell jar 212 of the present invention is better than the efficiency for adhering the particles 106' by bell jar 112 in the prior art. The cleaning step of the present invention cleans the oxide layer 207 formed on SiN film 206 of the CMOS sensor. However, the cleaning step in the prior art cleans the SiN film 106 of the CMOS sensor. No matter the bell jar 212 of the embodiment of the present invention or the bell jar 112 in the prior art, the composition for producing the bell jar 212 and the bell jar 112 is composed of silica, i.e. silicon dioxide, or aluminum oxide. The bell jar 212 and the bell jar 112 composed of silica or aluminum oxide adheres particles 206' composed of oxide better than adheres particles 106' composed of nitride. The different yield and different preventive maintenance period for changing a new bell jar between manufacturing CMOS sensors and manufacturing other kinds of MOS sensors is due to the composition of the particles produced in the cleaning step. The protective layer 106 composed of nitride for preventing the damage of the IMD layer 104 of a CMOS sensor is composed of nitride, but the protective layer 106 is not protected by anything in the prior art. The protective layer 106 composed of nitride is cleaned and the particles 106' composed of nitride is produced. The bell jar 112 cannot adhere the particles 106' very well. The particles 106' composed of nitride drops from the bell jar 112 to the prior COM sensors reduce the yield and the preventive maintenance period. However, the present protective layer, i.e. the silicon nitride layer 206, not only protects the IMD layer 204 but also is protected by an oxide layer 207 to prevent the particles composed of nitride. Thus the bell jar 212 adheres particles 206' of the present invention well to increase the yield for manufacturing the CMOS sensors and increase the preventive maintenance period for changing a new bell jar 212.

In the present embodiment, the cleaning step cleans the oxide layer 207 by radio frequency plasma. The oxide layer 207 may be cleaned by another method in another embodiment of the present invention. The inter-metal dielectric layer 204 composed of Ti and TiN.

The present invention provides a method for manufacturing complementary metal-oxide semiconductor sensors. The present invention increases the yield for manufacturing the CMOS sensors and reduce the cost of bell jars and the defective CMOS sensors. When manufacturing the CMOS sensors by the method of the present invention, a bell jar adhering none of particles composed of oxide replaces a used bell jar adhering and filling with particles composed of oxide after manufacturing the CMOS sensors on about 1250–1500 pieces of wafers. The preventive maintenance period for changing a bell jar of the present invention is longer than that in the prior art.

Obviously, many modifications and variations of the present invention are possible in light of the above teachings. It is to be understood that within the scope of the appended claims, the present invention may be practiced other than as specifically described herein.

Although the specific embodiments have been illustrated and described, it will be obvious to those skilled in the art that various modifications may be made without departing from what is intended to be limited solely by the appended claims.

What is claimed is:

1. A method for manufacturing a complementary metal-oxide semiconductor sensor, comprising:
   providing a semiconductor structure including a plurality of conductors thereon;
   forming a dielectric layer onto said conductors and said semiconductor structure;
   forming a protective layer onto said dielectric layer;
   forming a sacrificial layer on said protective layer;
   etching portions of said sacrificial layer, said protective layer, and said dielectric layer to expose said conductors; and
   cleaning said sacrificial layer and said exposed conductors.

2. The method according to claim 1, wherein said cleaning step cleans said sacrificial layer by radio frequency plasma.

3. The method according to claim 1, further comprising forming a plurality of plugs onto said exposed conductors.

4. The method according to claim 1, wherein said dielectric layer is composed of Ti/TiN.

5. The method according to claim 1, wherein said protective layer is a silicon nitride layer.

6. The method according to claim 1, wherein said sacrificial layer contains a material to substantially reduce particulate contamination in the cleaning step.

7. The method according to claim 6, wherein said material of said sacrificial layer is oxide.

8. A method for manufacturing a complementary metal-oxide semiconductor sensor, comprising:
   providing a semiconductor structure including a plurality of conductors thereon;
   forming a dielectric layer onto said conductors and said semiconductor structure;
   forming a protective layer onto said dielectric layer;
   forming a sacrificial layer on said protective layer;
   moving said complementary metal-oxide semiconductor sensor into a process chamber covered by a bell jar;
   etching portions of said sacrificial layer, said protective layer, and said dielectric layer to expose said conductors;
   cleaning said sacrificial layer and said exposed conductors; and
   removing said complementary metal-oxide semiconductor sensor from said process chamber.

9. The method according to claim 8, wherein said cleaning step cleans said sacrificial layer by radio frequency plasma.

10. The method according to claim 8, wherein said protective layer is a silicon nitride layer.

11. The method according to claim 8, wherein said sacrificial layer contains a material that is same as a composing material of said bell jar, such that particulate contamination generated from said protective layer in the cleaning step is substantially reduced.

12. The method according to claim 11, wherein said material of said sacrificial layer is oxide.

13. The method according to claim 11, wherein said composing material of said bell jar is silicon dioxide.

14. The method according to claim 11, wherein said composing material of said bell jar is aluminum oxide.

* * * * *